(12) United States Patent  (10) Patent No.: US 8,547,770 B2
Nakamura et al.  (45) Date of Patent: Oct. 1, 2013

(54) SEMICONDUCTOR APPARATUS AND ITS CONTROL METHOD

(75) Inventors: Kohei Nakamura, Tokyo (JP); Sachiko Kamisaki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 128 days.

(21) Appl. No.: 13/137,287

(22) Filed: Aug. 3, 2011

(65) Prior Publication Data

US 2012/0033521 A1 Feb. 9, 2012

(30) Foreign Application Priority Data

Aug. 4, 2010 (JP) ................................ 2010-175451

(51) Int. Cl.
*G11C 5/14* (2006.01)
(52) U.S. Cl.
USPC .......................................... 365/226; 365/229
(58) Field of Classification Search
USPC .................. 365/226–229, 189.011–225.7
See application file for complete search history.

(56) References Cited

U.S. PATENT DOCUMENTS

| 6,291,869 | B1 | 9/2001 | Ooishi | |
|---|---|---|---|---|
| 2006/0039206 | A1* | 2/2006 | Taniguchi et al. | 365/189.05 |
| 2007/0109901 | A1* | 5/2007 | Taniguchi et al. | 365/226 |
| 2007/0109902 | A1* | 5/2007 | Taniguchi et al. | 365/226 |
| 2007/0115747 | A1* | 5/2007 | Taniguchi et al. | 365/226 |
| 2010/0128549 | A1* | 5/2010 | Dudeck et al. | 365/226 |

FOREIGN PATENT DOCUMENTS

JP 2000-165224 A 6/2000

* cited by examiner

*Primary Examiner* — Harry W Byrne
(74) *Attorney, Agent, or Firm* — McGinn IP Law Group, PLLC

(57) ABSTRACT

Semiconductor apparatus includes first power supply line and second power supply line, first sub power supply line, first switch circuit, first logic circuit and first control circuit. First switch circuit is disposed between first power supply line and first sub power supply line, and controlled based on first signal. First logic circuit is disposed between first sub power supply line and second power supply line and comprises first input node and second input node receiving second signal and third signal respectively, and output node. First logic circuit outputs an active voltage associated with a logical level of second signal to output node in active state, and outputs a standby voltage associated with a voltage of second power supply line to output node regardless of the logical level of second signal in non-active state. First control circuit generates third signal based on first signal and fourth signal independent of first signal, and letting first logic circuit transit from non-active state to active state by providing third signal to second input node of first logic circuit.

8 Claims, 11 Drawing Sheets

SEMICONDUCTOR APPARATUS AND ITS CONTROL METHOD

REFERENCE TO RELATED APPLICATION

This application is based upon and claims the benefit of the priority of Japanese patent application No. 2010-175451, filed on. Aug. 4, 2010, the disclosure of which is incorporated herein in its entirety by reference thereto. This invention relates to a semiconductor apparatus and its control method. Particularly, the present invention relates to a semiconductor apparatus that enables a power shutdown (power gating).

TECHNICAL FIELD

Background

In recent years, the operating voltage in mobile devices such as cellular phones and digital cameras has been steadily getting lower. Since mobile devices are operated mainly by batteries, low power consumption is required even in a standby mode in which users do not use. Therefore, semiconductor memories used in mobile devices are also required for low power consumption in a standby mode as well as in a normal operation.

Thus, a technique referred to as power shutdown (power gating) is used in many peripheral control circuits in order to realize high speed operation and low leakage current in a low voltage mobile DRAM as represented by LPDDR2 (Low Power Double Data Rate 2). Power gating is a technique to realize low power consumption in a standby mode by disposing a sub power supply line or a sub ground line in addition to a main power supply line and a main ground line. And power gating shuts off a power supply and ground of a logic circuit from the main power supply line and the main ground line, in the state that the output node potential of the logic circuit is held at a specified potential, if it has to is held at the specified potential in a standby mode.

Specifically, a circuit, in which the output node has to be held at H level in a standby mode, is connected between the main power supply line and the sub ground line. And, a circuit, in which the output node has to be held at L level in a standby mode, is connected between the sub power supply line and the main ground line. Furthermore, the circuits are shut off from the main power supply line and the main ground line respectively in the standby mode. Then, in a standby mode, a source of a P-channel MOS transistor of a CMOS (Complementary Metal Oxide Semiconductor) circuit outputting H level signal is connected to the main power supply line, and a source of a N-channel MOS transistor is connected to the sub ground line. As a result, since the connection between the sub ground line and the main ground line is shut off in the standby mode, the leakage current does not flow between the main power supply line and the main ground line.

However, if a circuit to which a power gating is applied is disposed between the main power supply line and the sub ground line or between the sub power supply line and the main ground line, the logical level of the output node of the applied circuit must be determined in a design phase of the semiconductor apparatus.

On the other hand, there are circuits, in which logical levels of an input signal(s) and an output signal(s) vary in response to a setting of the semiconductor apparatus, inside the semiconductor apparatus, that is, circuits in which logical levels of an input signal(s) and an output signal(s) in a standby mode are not uniquely determined in a design phase of the semiconductor apparatus.

Patent document 1 discloses a method for reducing leakage current by applying a power gating to a circuit in which an output(s) of a logic circuit in a standby mode is not uniquely determined in a design phase of a semiconductor apparatus.

[Patent Document 1]:
Japanese Patent Kokai Publication No. JP-P2000-165224A, which corresponds to U.S. Pat. No. 6,291,869.

SUMMARY

The entire disclosure of Patent Documents 1 is incorporated herein by reference thereto. The following analyses are given according to the present invention.

As mentioned above, in accordance with the technique disclosed in Patent Document 1, it is possible to reduce the leakage current in a standby mode even if an output of a logic circuit is not uniquely determined. A semiconductor circuit disclosed in Patent Document 1 adopts a constitution in which voltage provided to the buffer power supply line is switched by a power supply selector based on a logical level of an input signal in a standby mode. However, since a lot of buffer power supply lines and a lot of power supply selectors are required in such a constitution, the circuit scale is increased.

As described above, there is much desired in the conventional technology.

In one viewpoint of the present invention, a semiconductor apparatus and its control method are desired, wherein the apparatus and the method suppress the circuit scale and enable a power gating for a semiconductor apparatus including a circuit, in which logical levels of an input signal(s) and an output signal(s) vary in response to a setting of the semiconductor apparatus, that is, a circuit in which logical levels of an input signal(s) and an output signal(s) in a standby mode are not uniquely determined in a design phase of the semiconductor apparatus.

In a first aspect of the present invention, there is provided a semiconductor apparatus comprising: a first power supply line and a second power supply line; a first sub power supply line; a first transistor coupled between the first power supply line and the first sub power supply line, and rendered conductive in response to a first signal; a first circuit coupled between the first sub power supply line and the second power supply line, receiving second and third signals and outputting an output signal; and a first control circuit generating the third signal in response to both of the first signal and a fourth signal that is independent of the first signal. The first circuit renders the output signal one of first and second logic levels designated by a logic level of the second signal during an active state, and fixes the output signal at the first logic level irrespective of the logic level of the second signal during an inactive state. The first control circuit provides the third signal with the first circuit such that the first circuit is released from the inactive state to the active state in response to the third signal.

In a second aspect of the present invention, there is provided a semiconductor apparatus comprising: a memory cell array; a first terminal receiving a first signal taking one of first and second logic levels, the semiconductor apparatus being in an active state during a first period of time when the first signal take the first logic level and being in an in active state during a second period of time when the first signal takes the second logic level; and a control unit controlling an access to the memory cell array. The control unit comprises: a main power supply line; a sub power supply line; a first transistor coupled between the main power supply line and the sub power supply line, rendered conductive during the first period of time and rendered nonconductive during the second period of time; a first circuit portion coupled to the sub power supply line, receiving second and third signals and outputting a first output signal to control the access to the memory cell array; and a first control circuit portion generating the third signal in response to both of the first signal and a fourth signal that is independent of the first signal. The first circuit renders, when activated, the first output signal one of third and fourth logic levels designated by a logic level of the second signal, and fixes, when deactivated, the first output signal at the third logic level irrespective of the logic level of the second signal. The first control circuit portion provides the third signal with the first circuit portion such that the first circuit portion is activated during a part of period of time of the first period of time and is deactivated during a remaining period of time of the first period of time and the second period of time.

In a third aspect of the present invention, there is provided a method comprising: producing an output signal fixed at a first logic level being free from a logic level of a mode signal; producing a first signal to connect a sub power line to a main power line; producing a command signal that is independent of the first signal after the sub power line has been connected to the main power line; and producing, in response to both of the first signal and the command signal, a control signal so that the output signal takes, when the mode signal takes a second logic level, the first logic level and takes, when the mode signal takes a third logic level, a fourth logic level.

The meritorious effects of the present invention are summarized as follows. According to each aspect of the present invention, a semiconductor apparatus with a small scale circuit configuration which enables a power gating is provided for the semiconductor apparatus having a circuit in which logical levels of an input signal(s) and an output signal(s) in a standby mode are not uniquely determined in a design phase of the semiconductor apparatus.

PREFERRED MODES

Figure 1:
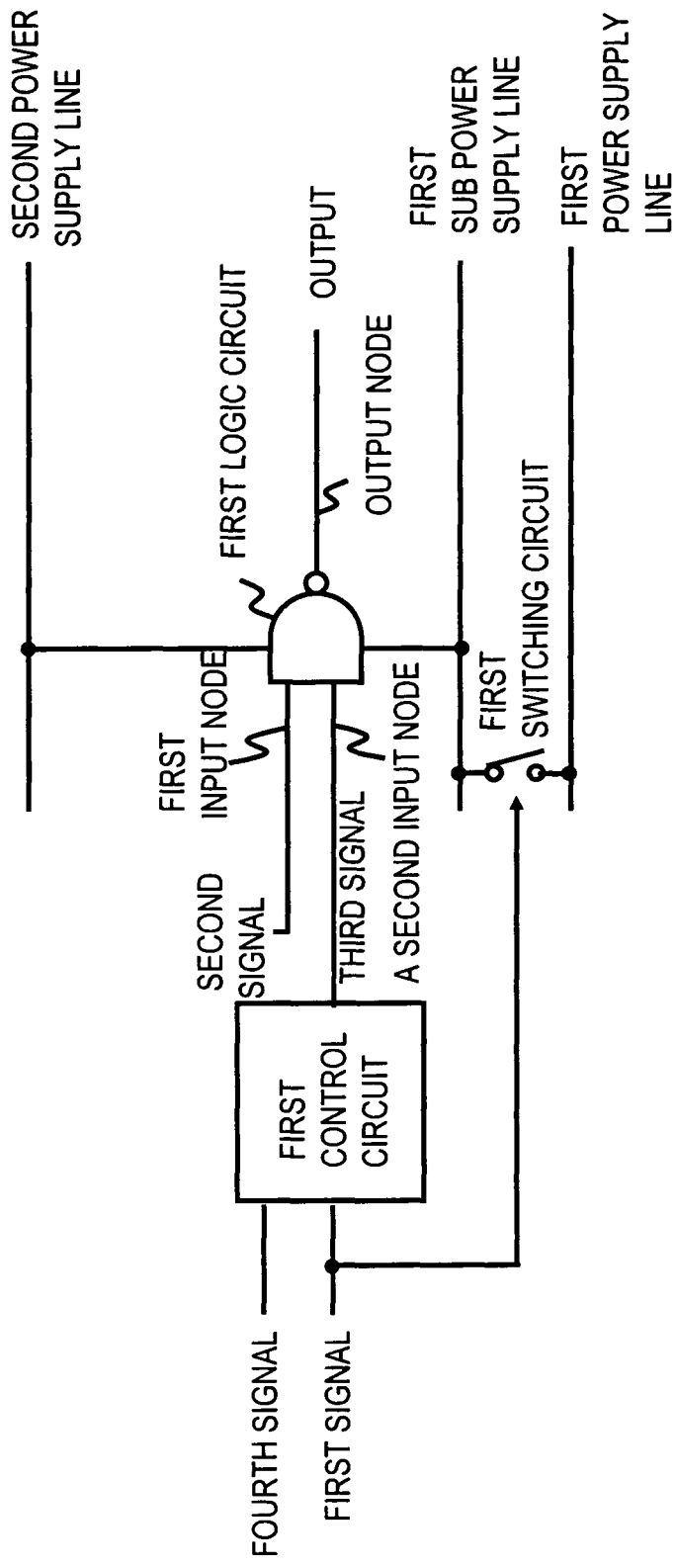
FIG. 1 is a diagram illustrating an outline of one mode of the present disclosure.

First, an overview of one mode of present invention will be explained with reference to FIG. 1. Note, however, the reference to figures mentioned herein is not for the limitation purpose, and merely intended for helping better understanding of the disclosure. Here, it is assumed that a power gating is applied to a first logic circuit, and the first logic circuit is connected between a second power supply line and a first sub power supply line. In FIG. 1, a state between the first sub power supply line and a first power supply line can be switched between conductive and nonconductive states by a first switch circuit, and the switching is performed based on a first signal. A third signal is generated so that the first logic circuit outputs a logical level depending on a logical level of a second signal to an output node of its own in an active state, and whereas the first logic circuit outputs a logical level corresponding to the second power supply line regardless of the logical level of the second signal to the output node of its own in a non-active state (when a power gating is applied).

In a first control circuit, the third signal is generated from the first signal and a fourth signal which are independent of each other. A power supply, which is provided to the first logic circuit in a non-active state, is controlled by the first signal; when the first logic circuit transits from a non-active state to an active state, the first control circuit does not let the first logic circuit transit to the active state merely based on the first signal, but it lets the first logic circuit transit to the active state at an appropriate timing point by an additional use of the fourth signal.

The use of the first control circuit enables a power gating with a small scale circuit configuration for a semiconductor apparatus having a circuit, in which logical levels of an input signal(s) and an output signal(s) in a standby state are not uniquely determined in a design phase of the semiconductor apparatus.

Next, an overall constitution of a semiconductor apparatus in accordance with one exemplary embodiment of the present invention will be explained.

Figure 2:
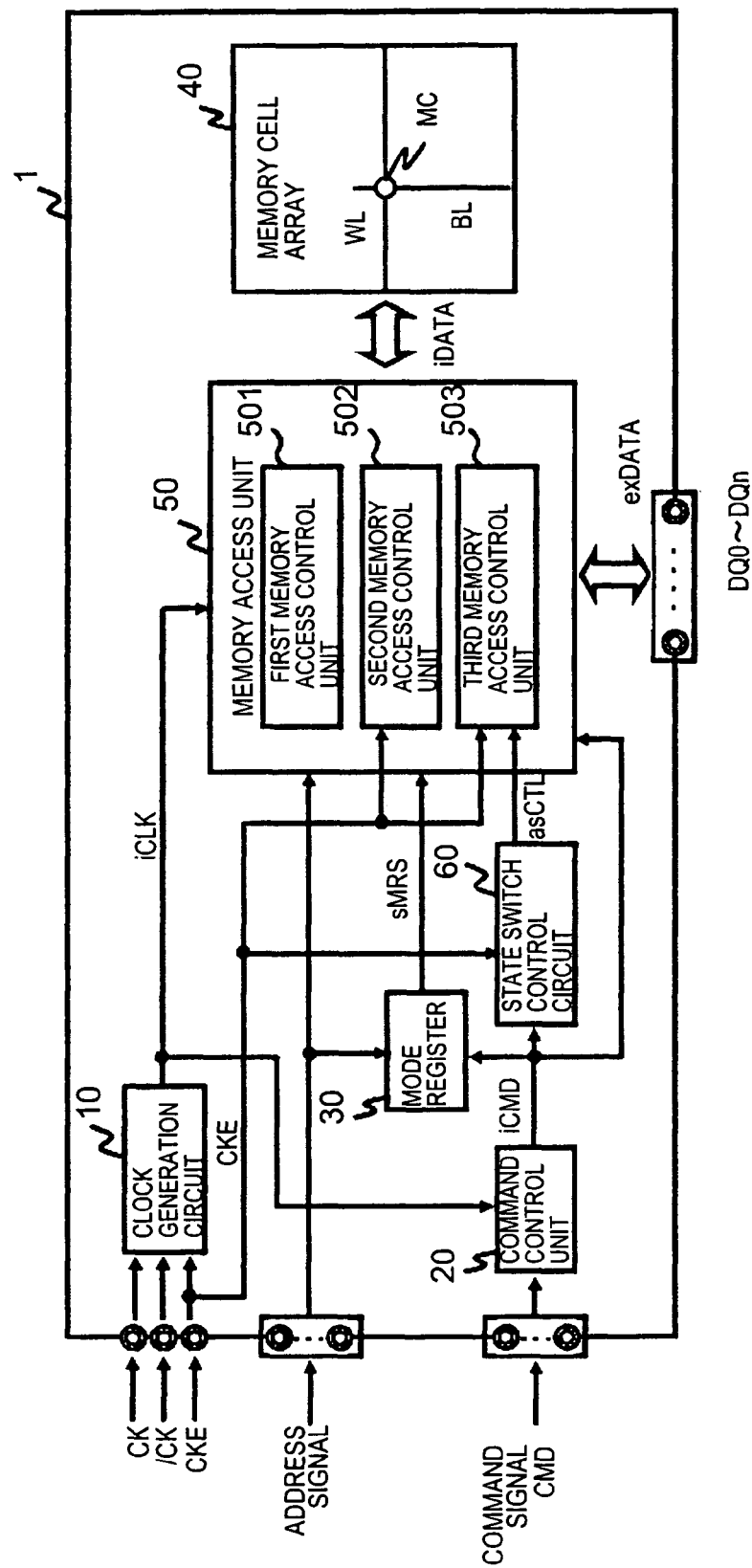
FIG. 2 is a block diagram showing an overall constitution of the semiconductor apparatus in accordance with a first exemplary embodiment of the present invention.

FIG. 2 is a block diagram showing an overall constitution of a semiconductor apparatus in accordance with one exemplary embodiment of the present invention. A semiconductor apparatus in FIG. 2 includes a clock generation circuit 10, a command control unit 20, a mode register 30, a memory cell array 40, a memory access unit 50 and a state switch control circuit 60.

The semiconductor apparatus receives an external clock signal CK, a reversed signal of the external clock signal CK/CK, a clock enable signal CKE, address signal, data signal DQ0 to DQn and command signal CMD. The semiconductor apparatus changes an operating state based on the clock enable signal CKE. For example, the semiconductor apparatus becomes a standby state (low power consumption operating mode) when the clock enable signal CKE is L level and an active state (operating mode) when the clock enable signal CKE is H level.

Clock generation circuit 10 generates an internal clock signal iCLK based on the external clock signal CK and the reversed signal of the external clock signal CK/CK, and provides the internal clock signal iCLK to the command control unit 20 and the memory access unit 50. Generating/stopping of the internal clock signal iCLK is switched depending on a logical level of the clock enable signal CKE. Specifically, if the clock enable signal CKE is L level, a generation of the internal clock iCLK is stopped. And if the clock enable signal CKE is H level, the internal clock iCLK is generated.

The command control unit 20 includes a command decoder which decodes an external command signal received from the outside of the semiconductor apparatus, and generates an internal command signal iCMD based on the external command. The generated internal command signal iCMD is provided to the mode register 30, the memory access unit 50 and the state switch control circuit 60 respectively.

The mode register 30 generates control information of the memory access unit 50 from an address signal and the internal command signal iCMD received from the outside, and holds the control information. The generated control information is provided to the memory access unit 50 as a mode register set signal sMRS. The mode register 30 is activated if the internal command iCMD, which requests a mode register set, is issued from the command control unit 20. In the active state, the mode register 30 rewrites the information of operation setting in response to the mode register set code received through the address signal.

The memory cell array 40 is constituted by a plurality of word lines and a plurality of bit lines, and includes memory cells arranged at the individual intersection points between the word lines and the bit lines. The memory cells hold the data.

The memory access unit 50 receives the internal clock signal iCLK, the clock enable signal CKE, the address signal, the data signals DQ0 to DQn, the internal command signal iCMD, the mode register set signal sMRS, and a state control signal asCTL which is issued from the state switch control circuit 60.

In write operation, the memory control unit 50 writes an external data exDATA provided from data terminals DQ0 to DQn to a predetermined memory cell as an internal data iDATA. In read operation, the memory control unit 50 controls so that the internal data iDATA held in a predetermined memory cell is outputted to the outside of the semiconductor apparatus as the external data exDATA.

The memory cell access unit 50 includes a first memory cell access control unit 501, a second memory cell access control unit 502, and a third memory cell access control unit 503.

The first memory cell access control unit 501 is connected between a main power supply line VDDM and a main ground line VSSM, and is a circuit which operates by power supply voltage VDDM-VSSM regardless of the state of the semiconductor apparatus (active state or standby state).

On the other hand, the second memory cell access control unit 502 and the third memory cell access control unit 503 are disposed between either the main power supply line VDDM or a sub power supply line VDDS and either a sub ground line VSSS or the main ground line VSSM. The second memory cell access control unit 502 and the third memory cell access control unit 503 are circuits which operate by the power supply voltage VDDM-VSSM in an active state or operate by the power supply voltage either VDDS-VSSM or VDDM-VSSS in a standby state.

Furthermore, the second memory access control unit 502 is a circuit in which logical levels of an input signal(s) and an output signal(s) in a standby state are uniquely determined in a design phase of the semiconductor apparatus.

On the other hand, the third memory cell access control unit 503 is a circuit in which logical levels of an input signal(s) and an output signal(s) in a standby state are selected as appropriate based on a setting state of the semiconductor apparatus in a design phase of the semiconductor apparatus. If the semiconductor apparatus is a DRAM, CAS latency control circuit, Burst Length control circuit and ZQ code control circuit etc. are considered as a circuit in which logical levels of an input signal(s) and an output signal(s) in a standby state are not uniquely determined in a design phase of the semiconductor apparatus as just described, that is, a circuit in which logical levels of an input signal(s) and an output signal(s) vary in response to a setting of the semiconductor apparatus.

The state switch control circuit 60 provides the state control signal asCTL, which controls a transition timing to an active state/standby state of the third memory access control unit 503, to the third memory cell access control unit 503 when the semiconductor apparatus transits from an active state to a standby state or from a standby state to an active state.

In the following preferred exemplary embodiments will be disclosed in more detail.

First Exemplary Embodiment

Figure 3:
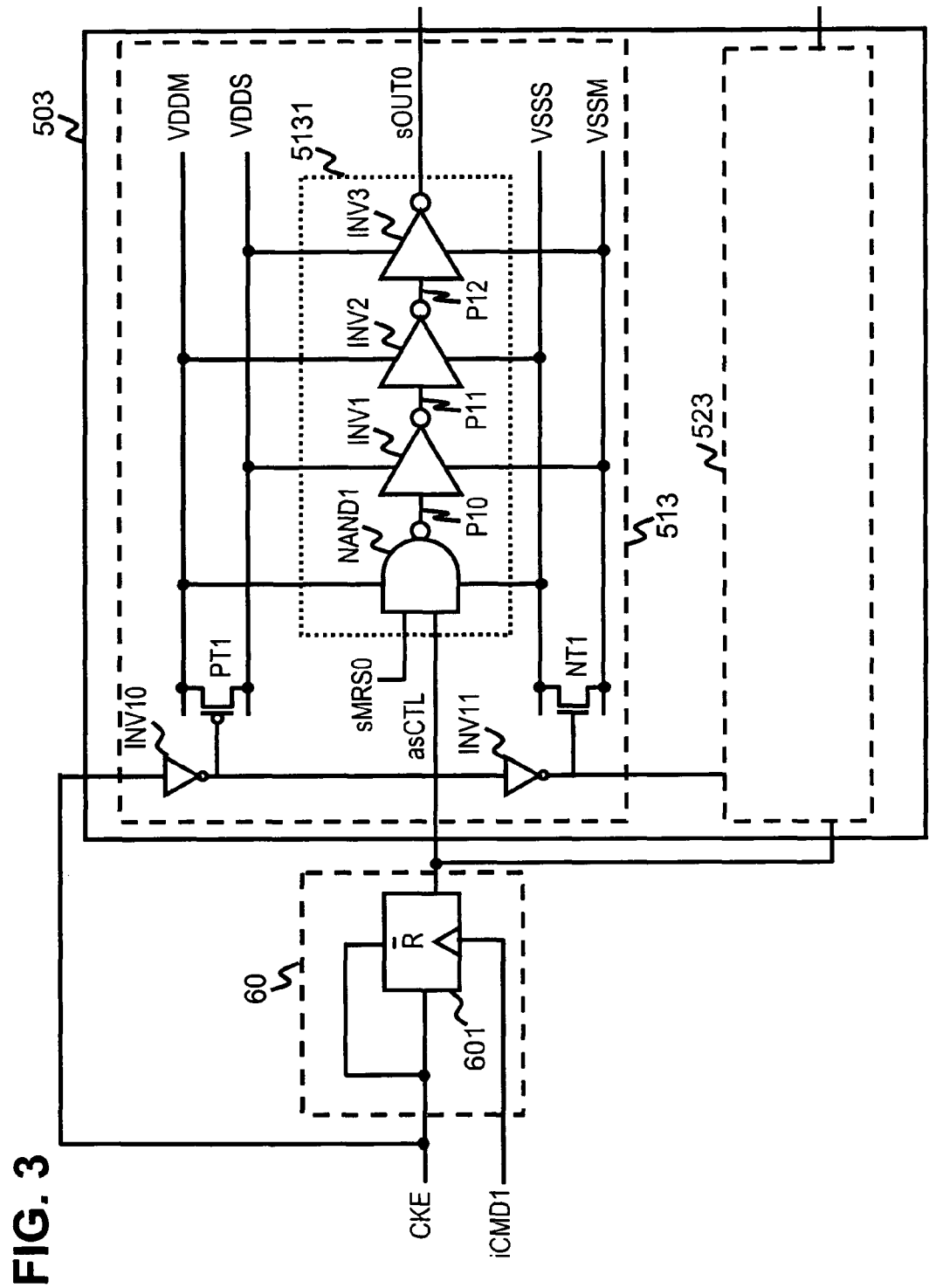
FIG. 3 is a diagram showing details of the third memory access control unit and the state switch control circuit in FIG. 2.

Next, a first exemplary embodiment of the present invention will be described in more detail with reference to FIG. 3. FIG. 3 is a diagram showing details of the third memory cell access control unit 503 and the state switch control circuit 60 in FIG. 2.

The third memory cell access control unit 503 includes a plurality of third memory cell access control circuits in which logical levels of an input signal(s) and an output signal(s) in a standby state are selected as appropriate in response to a setting state of the semiconductor apparatus. In FIG. 3, a constitution of the third memory cell access control circuit 513, which is one of a plurality of third memory cell access control circuits, is mainly illustrated. And there are mode register set signals sMRS corresponding to a plurality of third memory cell access control circuits, and sMRS0 is illustrated as a signal corresponding to the third memory cell access control circuit 513.

The third memory cell access control circuit 513 includes a logic circuit 5131, to which a power gating is applied, and transistors for the power gating PT1 and NT1. As one example of logic circuit 5131, a circuit which is constituted by NAND circuit NAND1 and inverter circuits (INV1 to INV3) will be considered. An input of NAND1 is connected to the mode register set signal sMRS0, and another input of NAND1 is connected to asCTL which is outputted from the state switch control circuit 60. Furthermore, NAND1 and inverter circuits (INV1 to INV3) are connected in series respectively, and nodes between the elements are denoted by P10 to P12.

PT1 and NT1 are transistors for the power gating respectively, and are controlled to be conductive/nonconductive by the clock enable signal CKE through inverters INV10, INV11. In an active state, power supply voltages are Provided from the main power supply line VDDM and the main ground line VSSM to the sub power supply line VDDS and the sub ground line VSSS respectively. In an non-active state, the sub power supply line VDDS and the sub ground line VSSS are controlled to be in a floating state by shutting off the sub power supply line VDDS and the sub ground line VSSS from the main power supply line VDDM and the main ground line VSSM respectively. The memory access control circuit of the second memory cell access control unit 502 also has the same constitution.

The third memory cell access control circuit 513 is in an active state when the semiconductor apparatus is in an active state, and outputs a logical level depending on the logical level of the corresponding to the mode register set signal sMRS0 as an output signal sOUT0. The other control circuits (the first memory cell access control unit 501 to the third memory cell access control unit 503) operates depending on the sOUT0 signal. Or, writing/reading data is performed at the memory cell array 40.

On the other hand, when the semiconductor apparatus is in a standby state, the third memory cell access control circuit 513 is in a non-active state, and the output signal sOUT0 is held at one of logical levels (L level in FIG. 3) regardless of the logical level of the mode register set signal sMRS0. A logical level of sOUT in a non-active is determined depending on constituent elements constituting the logic circuit 5131 and which of the main power supply line VDDM and the main ground line VSSM the elements are constituted to be connected to in a standby state.

Next, the state switch circuit 60 will be described. The state switch control circuit 60 includes latch circuit 601, and the clock enable signal CKE and internal command signal iCMD1 are connected to the latch circuit 601. The clock enable signal CKE is connected to a data terminal and a reset terminal (/R), and the internal command signal iCMD1 is connected to a clock terminal.

Figure 4:
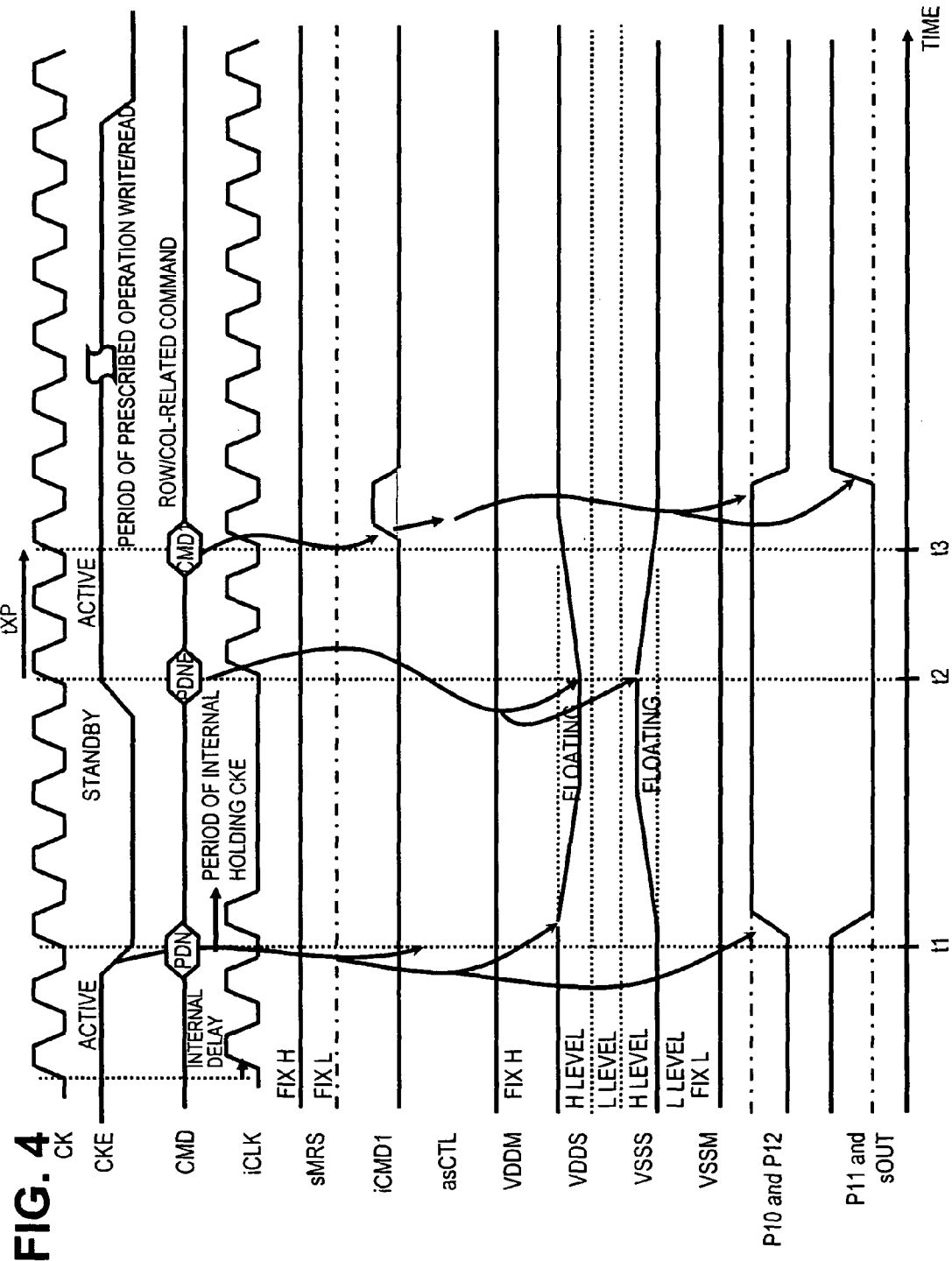
FIG. 4 is a timing chart showing an operation of the semiconductor apparatus in FIG. 2.

Next, the operation of the semiconductor apparatus in accordance with the present embodiment will be described. FIG. 4 is a diagram showing an operation timing of the semiconductor apparatus in accordance with the present embodiment. In vertical axis of FIG. 4, described are the external clock signal CK, the clock enable signal CKE, the command CMD issued to the semiconductor apparatus, the internal clock signal iCLK, the mode register set signal sMRS, the internal command signal iCMD1 issued to the third memory cell access control circuit 513, the state control signal asCTL, the voltage of each power supply line (VDDM, VDDS, VSSS, VSSM) and the voltage of each node (P10 to P11), and the voltage of sOUT.

At time T1 in FIG. 4, the clock enable signal CKE falls from H level to L level, and a power down command PDN is issued to the semiconductor apparatus so that the semiconductor apparatus transits from an active state to a standby state. When the semiconductor apparatus transits from an active state to a standby state, the output of the latch circuit 601 is reset in response to the transition from H level to L level of the clock enable signal CKE, so that the latch circuit 601 outputs L level. As a result, the state control signal asCTL being L level is provided to NAND1.

Furthermore, PT1 and NT1 become a nonconductive state respectively in response to the transition to L level of the clock enable signal CKE, so that the sub power supply line VDDS and the sub ground line VSSS become floating state.

Since NAND1 in the logic circuit 5131 outputs H level (node P10 is H level), the nodes are reversed sequentially just like the node P11 is L level and the node P12 is H level, so that leakage current does not flow.

On the other hand, a situation, in which the clock enable signal CKE rises from L level to H level and a power down exit command PDNE is issued to the semiconductor apparatus, so that the semiconductor apparatus transits from a standby state to an active state, is considered (time T2). In this case, the latch circuit 601 does not renew the L level being held at the time point that the clock enable signal CKE transits from L level to H level. The state control signal asCTL is held at L level at the time point. In response to the rising of the clock enable signal CKE, transistors for the power gating PT1 and NT1 are conductive together, the voltages of sub power supply line VDDS and sub ground line VSSS gradually approach to the voltages of main power supply line VDDM and main ground line VSSM respectively.

Furthermore, after the clock enable signal CKE transits from L level to H level, the first command CMD1 is issued from outside of the semiconductor apparatus to the semiconductor apparatus after a predetermined time period. The predetermined time period is a period in which command issuance is prohibited during a constant period starting from a release of a standby mode as the semiconductor apparatus specifications. In FIG. 4, time period tXP corresponds to the predetermined time period. During the period tXP, the voltages of sub power supply line VDDS and sub ground line VSSS have become nearly equal to the voltages of main power supply line VDDM and main ground line VSSM respectively.

Then, the first internal command iCMD1 corresponding to the first command CMD1 is issued to the third memory cell access control circuit 513 from the command control unit 20, and in the latch circuit 601 the clock enable signal CKE being H level is latched at the edge of transiting from L level to H level of the first internal command iCMD1 so that the latch circuit 601 outputs H level as the state control signal asCTL (time t3). In response to the transition to H level of the asCTL signal, the logic circuit 5131 including NAND1 transits to an active state so as to be able to operate.

As the specific example of the first external command, there are ACT command, WRITE command and READ command etc. As mentioned above, the issuance of these external commands is prohibited during the constant period starting from the recovery of the clock enable signal CKE. Therefore, since the internal circuits of the semiconductor apparatus start operating sequentially after the first external command mentioned above is received, there are no problems in the operation of the overall semiconductor apparatus if the operation of the third memory cell access control circuit 513 is recovered before the internal circuits start operating.

As mentioned above, the semiconductor apparatus includes the state switch control circuit 60; power supply voltages are provided to the sub power supply line VDDS and the sub ground line VSSS during the constant time from the rising of the clock enable signal CKE to the time point, at which the first command is issued after. A non-active state of the memory access control unit is released in response to an issuance of the first command, which enables to transit to an active state after the sub power supply line and the sub ground line are fully recovered.

As a result, comparing with the technique described in Patent Document 1 which includes a plurality of buffer lines and a plurality of switches for switching, a power gating with a smaller scale circuit can be applied even if an output node(s) of the logic circuit in a standby state is not uniquely determined. And since only the state switch control circuit 60 is necessary when the present invention is carried out, it is obvious that circuits in the present invention are smaller scaled than the circuit disclosed in Patent Document 1 in which a lot of buffer power supply lines and a lot of power supply selectors are needed.

Figure 5:
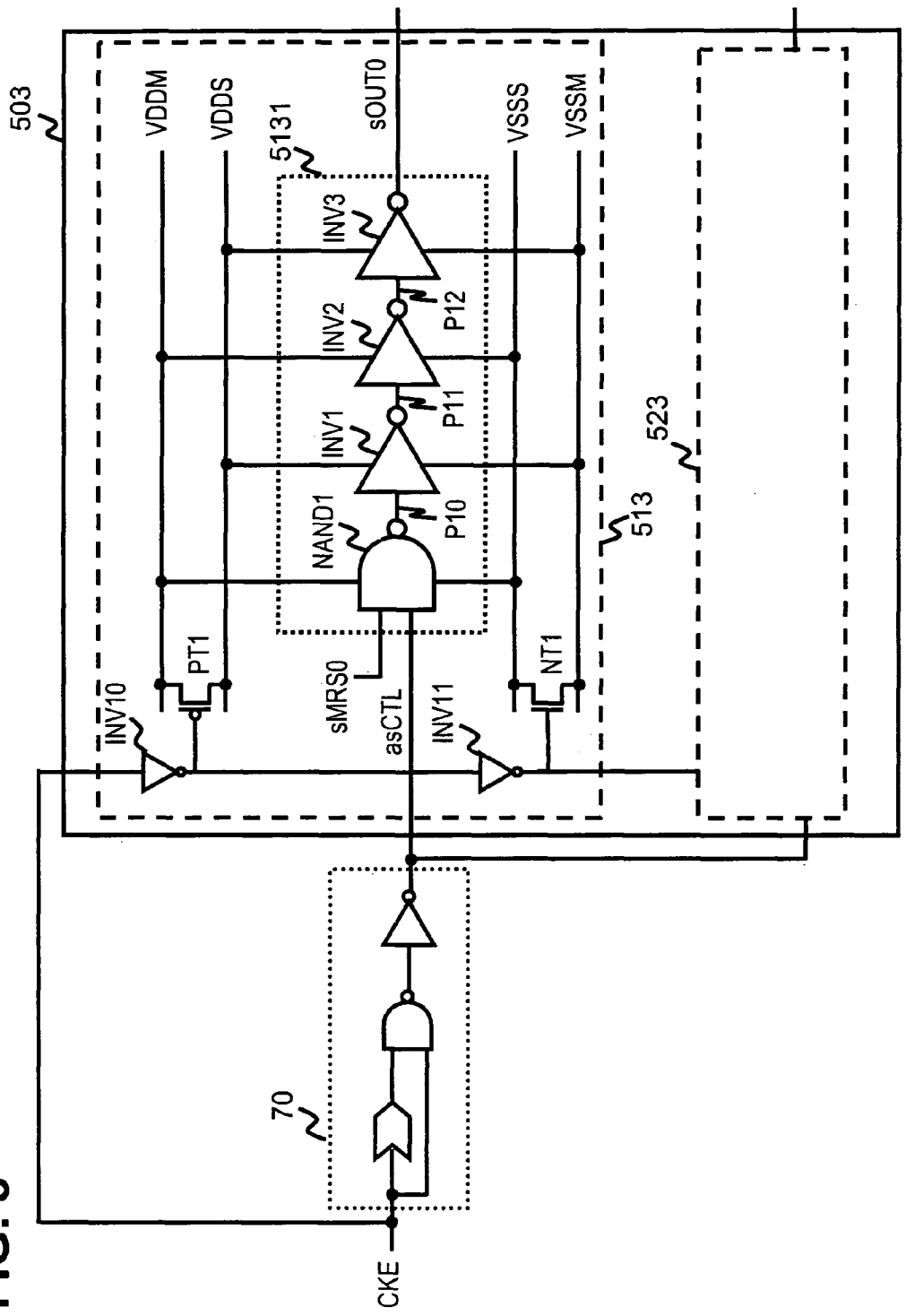
FIG. 5 is a diagram showing the comparison example applying a power gating to the semiconductor apparatus in which a logical level(s) of an output signal(s) in a standby state is not uniquely determined.

If the output(s) of the logic circuit in a standby state is not uniquely determined in the semiconductor apparatus, a circuit configuration as in FIG. 5 is considered. The semiconductor apparatus of the comparison example as shown in FIG. 5 is different from the semiconductor apparatus in the first exemplary embodiment in that the semiconductor apparatus of the comparison example as shown in FIG. 5 includes a delay circuit 70 instead of the state switch control circuit 60. Since the other constituent elements are the same, they are denoted by the same symbols and the explanations will be omitted. The clock enable signal CKE is the only input to the delay circuit 70, which outputs the state control signal asCTL. If the clock enable signal CKE is used as the state control signal asCTL without delay, there is a possibility that the standby state of the logic circuit 5131 is released in the state that the recoveries of the sub power supply line VDDS and the sub ground line VSSS are not enough.

That is to say, if a non-active state of the logic circuit 5131 is released when the recoveries of the sub power supply line VDDS and the sub ground line VSSS are not enough, NAND1 connected to the sub ground line VSSS cannot output L level, but outputs a middle potential. Both the p-channel transistor and the n-channel transistor of the inverter INV1 connected to the sub power supply line VDDS become conductive states together, so that penetrating current flows.

Hence, a time interval, at which the sub power supply line VDDS potential and the sub ground line VSSS potential are recovered, is secured by letting the state control signal asCTL be delayed from the clock enable signal CKE. However, the necessary delay time is greatly different due to the difference of conditions such as ambient temperature, and hence, it is considered as follows: if the rising of the state control signal asCTL is slow, the semiconductor apparatus cannot transit to an active state during the time period defined in the specifications; on the other hand, if the rising of the release signal is too early, the above-mentioned penetrating current flows.

Figure 6:
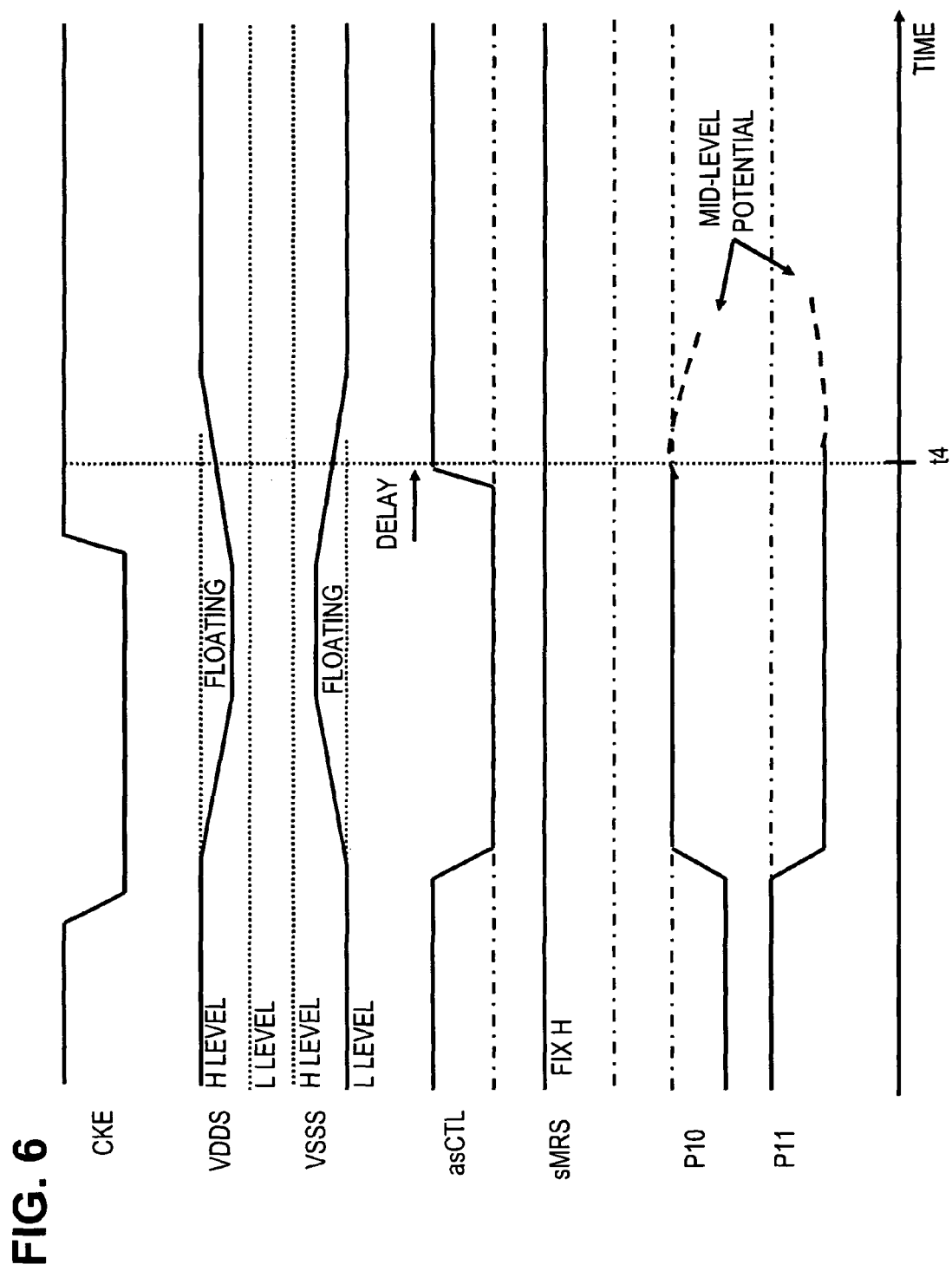
FIG. 6 is a timing chart showing an operation of the semiconductor apparatus in FIG. 5.

FIG. 6 is a timing chart when a power gating is applied to the semiconductor apparatus including the delay circuit 70. Waveforms in FIG. 6 show each of signals in the case that the state control signal asCTL rises before the sub power supply line VDDS potential and the sub ground line VSSS potential are recovered (time t4). Thus, if the merely delayed clock enable signal CKE is used as the state control signal asCTL, the above-mentioned problem may possibly occur.

However, because the semiconductor apparatus includes the state switch control circuit 60 described in the present embodiment and controls the state control signal asCTL at an appropriate timing point, the problems, in which delay time of more than necessary is secured to recover the sub power supply line VDDS potential and the sub ground line VSSS potential, or penetrating current flows due to the delay time not being secured enough for the recovery, do not occur.

Figure 7:
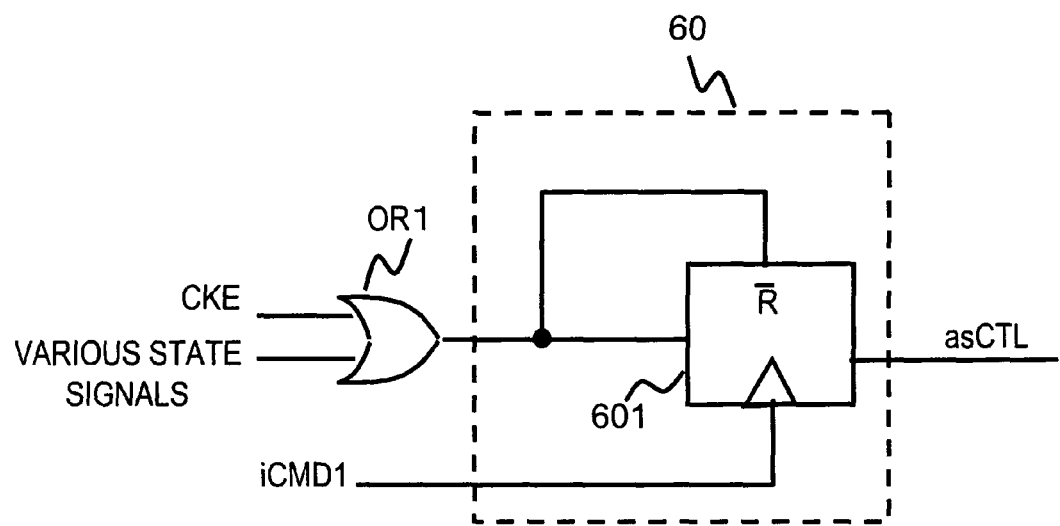
FIG. 7 is a diagram illustrating another signal connection to the state switch control circuit in FIG. 2.

A constitution, in which the clock enable signal CKE connected to the state switch control circuit 60 is logically operated with other various state signals, may be used as shown in FIG. 7. This is because if it is assumed that the semiconductor apparatus is DRAM, a power gating is flexibly applied to a plurality of standby modes such as active power down APDN and idle power down IPDN, which are existing standby states.

An active power down APDN is a state in which the clock enable signal CKE has transited from H level to L level in a bank active state. And, a bank active state is a state before transiting to a standby state or after recovering from the standby state.

An idle power down IPDN is a state in which CKE has transited from H level to L level in a bank idle. And, a bank idle is a state before transiting to the standby state or after recovering from the standby state.

Thus, when there are a plurality of standby states of the semiconductor apparatus, a design can be performed for the second memory cell access control unit 502 and the third memory cell access control unit 503 respectively so that active state or non-active state is selected as appropriate for each of the standby states.

For example, it is assumed that the second memory cell access control unit 502 and the third memory cell access control unit 503 are functionally separated to two units of Row-related control circuit(s) and Col-related control circuit(s) respectively. A power gating can be flexibly applied, for example, the Col-related control circuit is in a non-active state while the Row-related control circuit(s) holds the active state in an active power down APDN state, or both the Row-related and Col-related control circuits are in a non-active state together in an idle power down IPDN state, or the like.

Since it is necessary that the power gatings have to be controlled independently, each power gating has to be disposed independently for each of these two related control circuits. In this case, this is applicable by letting the input to the state switch control circuit 60 be a logical addition of CKE and each state signal (Bank Active information etc.) depending on the objective.

If a third memory cell access control circuit is disposed physically apart from the other third memory cell access control circuits in the semiconductor apparatus, another state switch control circuit may be disposed. Or, if the third memory access control circuits are controlled independently each other and a plurality of power gatings are applied to the third memory access control circuits respectively, a constitution, in which each state switch circuit is disposed for each power gating controlled independently each other, may be used. These are common in the following exemplary embodiment.

Second Exemplary Embodiment

Figure 8:
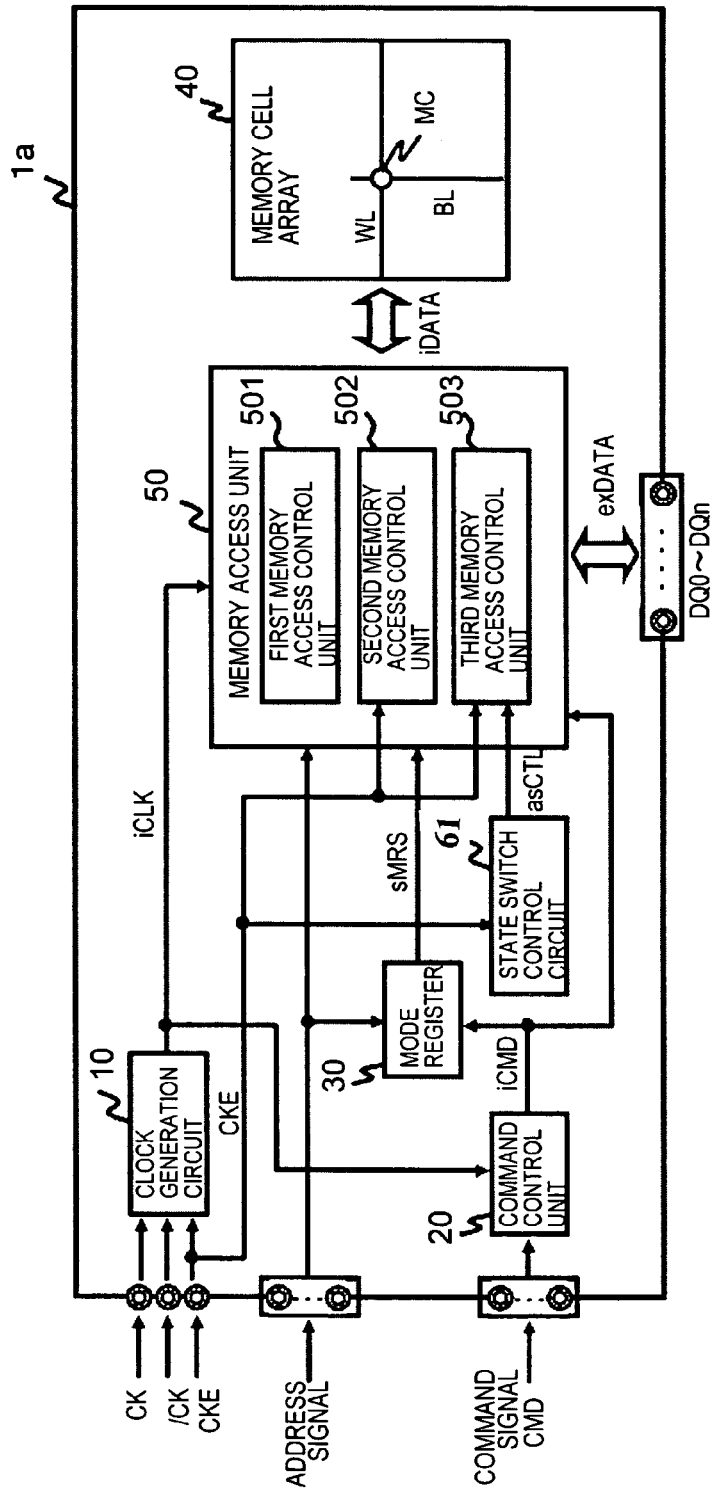
FIG. 8 is a block diagram showing an overall constitution of the semiconductor apparatus in accordance with the second exemplary embodiment of the present invention.

Next, the second exemplary embodiment will be explained in detail with reference to the drawings. FIG. 8 is a block diagram showing an overall constitution of semiconductor apparatus 1a in accordance with the second exemplary embodiment.

The difference from the semiconductor apparatus in FIG. 2 resides in that the internal constitution of state switch control circuit 61 is different, and the internal command signal iCMD is not issued to the state switch control circuit 61 from the command control unit 20. Since the other constituent elements are the same, they are denoted by the same symbols, and the explanations will be omitted.

Figure 9:
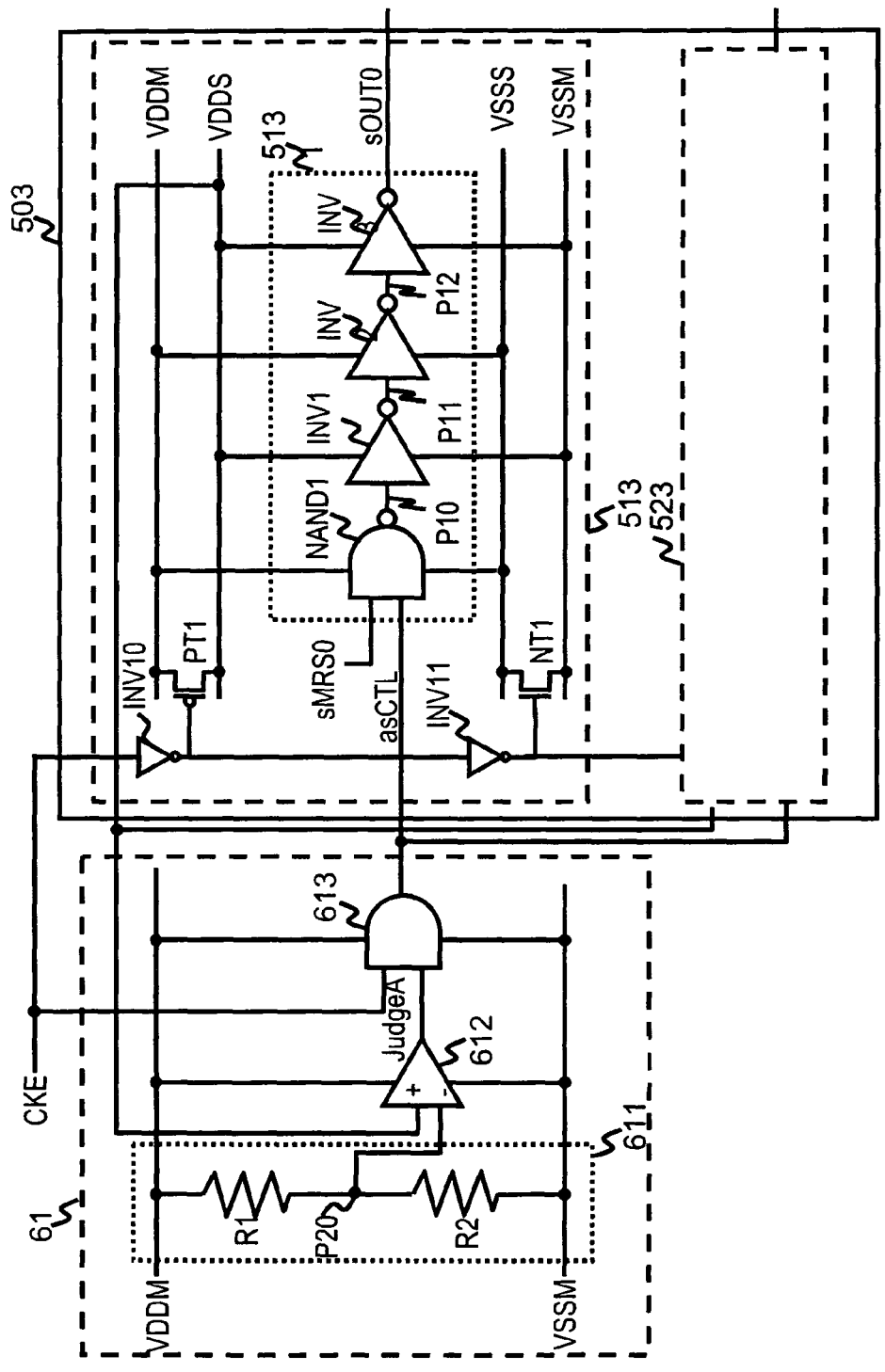
FIG. 9 is a diagram showing details of the third memory access control unit and the state switch control circuit in FIG. 8.

FIG. 9 is a diagram showing details of the third memory cell access control unit 503 and the state switch control circuit 61 in FIG. 8. Since the third memory cell access control unit 503 of the present embodiment is the same as the third memory cell access control unit 503 of the first exemplary embodiment, the explanation will be omitted.

The state switch control circuit 61 includes a judgment voltage generation unit 611, a comparator 612 and an AND circuit 613. A reference potential, which is generated in the judgment voltage generation circuit 611, and the sub power supply line VDDS potential are compared at the comparator 612; when the sub power supply line VDDS potential is higher than the reference potential after the clock enable signal CKE transits from L level to H level, the output varies from L level to H level so as to be outputted as JudgeA. Furthermore, the AND circuit 613 outputs a logical product of JudgeA and the clock enable signal CKE as asCTL.

The resistance values of resistors R1 and R2 in the judgment voltage generation circuit 611 are set so that node P20 potential becomes the sub power supply line VDDS potential in which the logic circuit 5131 of the third memory cell control circuit 513 can operate stably.

Figure 10:
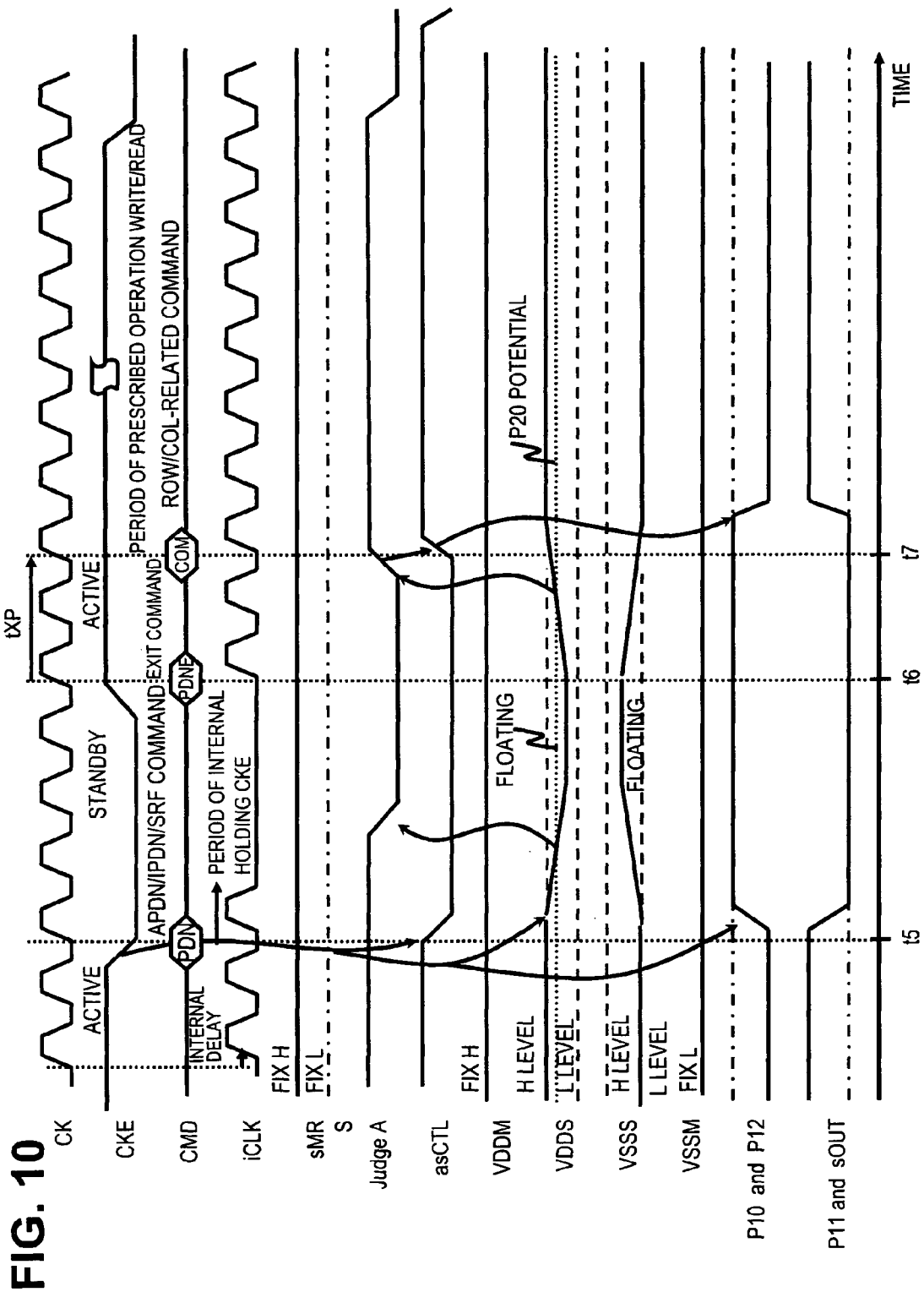
FIG. 10 is a timing chart showing an operation of the semiconductor apparatus in FIG. 8.

Next, the operation of the semiconductor apparatus in accordance with the present embodiment will be explained. FIG. 10 is a diagram showing an operation timing of the semiconductor apparatus in accordance with the present exemplary embodiment. In FIG. 10, JudgeA is added to the timing chart in FIG. 6.

Since operations, in which the clock enable signal CKE falls from H level to L level at time t5, and the power down command PDN is issued to the semiconductor apparatus, and the semiconductor apparatus transits from an active state to a standby state so that the power gating is operated effectively, are the same, as in the first exemplary embodiment, the explanation will be omitted.

After that, the clock enable signal CKE rises at time t6, and a standby state is released. In the present embodiment, the state switch control circuit 61 monitors the sub power supply line VDDS potential, and lets the logic circuit 5131 transits from a non-active state to an active state after the sub power supply line VDDS has fully risen.

In FIG. 10, after the supply to the sub power supply line VDDS is started, JudgeA rises from the comparator 612 at the timing point that the voltage of the sub power supply line VDDS becomes over the voltage of node P20 (time t7), and asCTL rises in response to JudgeA being H level. After that, the third memory cell access control unit 503 transits to an active state just like in the first exemplary embodiment.

Figure 11:
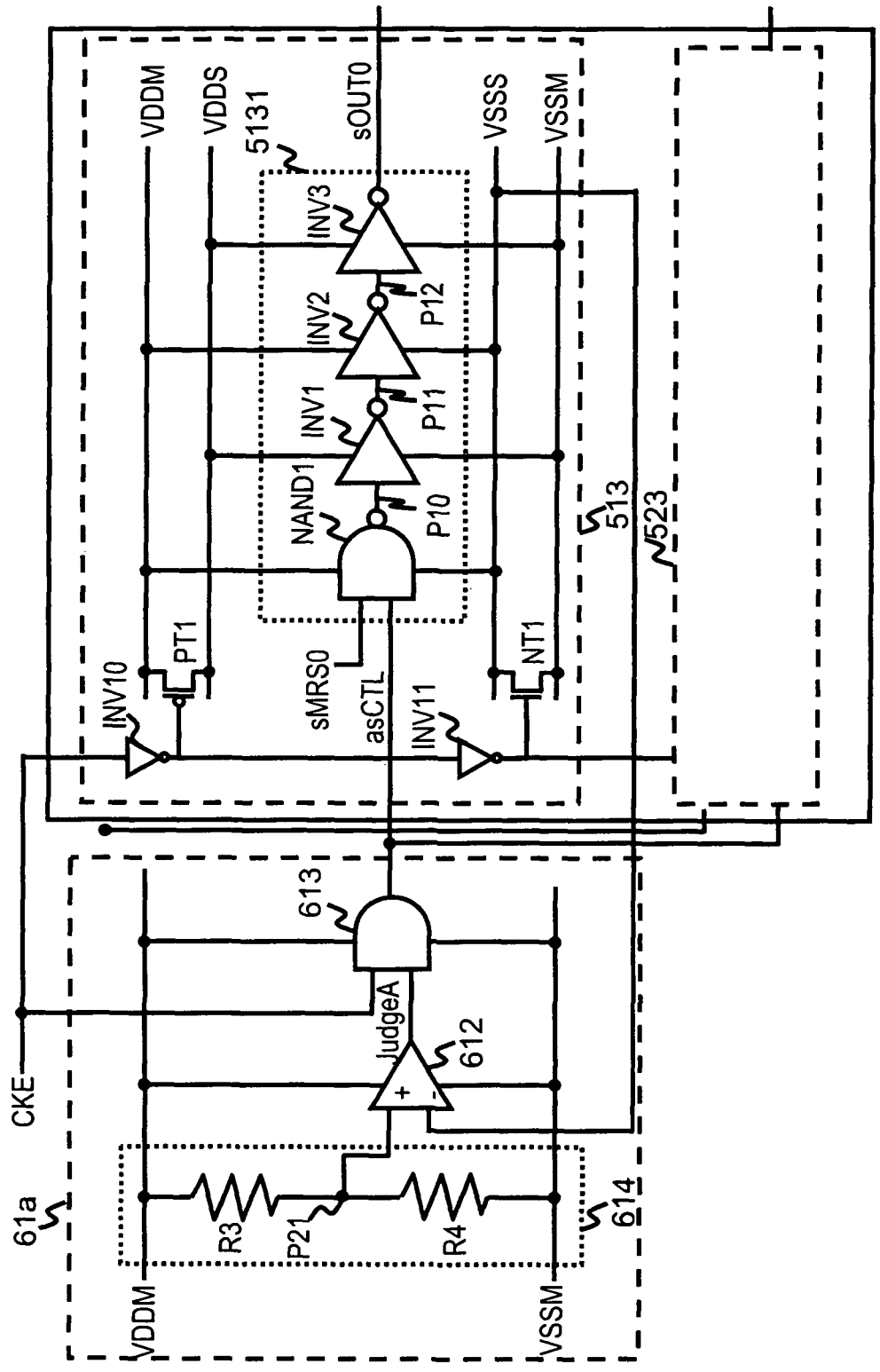
FIG. 11 is a diagram showing another circuit configuration in the state switch control circuit in FIG. 8.

The state switch control circuit 61 may have a constitution in which the sub ground line VSSS is monitored instead of the sub power supply line VDDS (see FIG. 11). In this case, it may be a constitution in which the sub ground line VSSS is connected to the reversed input side of the comparator 612 and the non-reversed input side of the comparator 612 receives the output of the judgment voltage generation circuit 614. And the resistance values of resistors R3 and R4 are set so that node P21 potential becomes the sub power ground line VSSS potential in which the logic circuit 5131 of the third memory access control unit 503 can operate stably, are used instead of resistances R1, R2 of the judgment voltage generation circuit 611.

In the present embodiment, it is also possible to transit the circuit, to which a power gating is applied, to an active state after the sub power supply line VDDS and the sub ground line VSSS are fully recovered by generating the state control signal asCTL due to the recoveries of the sub power supply line VDDS or the sub ground line VSSS.

Further, the disclosure of Patent Document abovementioned is incorporated herein by reference thereto. It should be noted that other objects, features and aspects of the present invention will become apparent in the entire disclosure and that modifications may be done without departing the gist and scope of the present disclosure as disclosed herein and claimed as appended herewith.

Also it should be noted that any combination and/or selection of the disclosed and/or claimed elements, matters and/or items may fall under the modifications aforementioned.

What is claimed is:

1. A semiconductor apparatus comprising:
    a first power supply line and a second power supply line;
    a first sub power supply line;
    a first transistor coupled between the first power supply line and the first sub power supply line, and rendered conductive in response to a first signal;
    a first circuit coupled between the first sub power supply line and the second power supply line, receiving second and third signals and outputting an output signal, the first circuit rendering the output signal one of first and second logic levels designated by a logic level of the second signal during an active state, and fixing the output signal at the first logic level irrespective of the logic level of the second signal during an inactive state; and
    a first control circuit generating the third signal in response to both of the first signal and a fourth signal that is independent of the first signal, and providing the third signal with the first circuit such that the first circuit is released from the inactive state to the active state in response to the third signal.

2. The semiconductor apparatus according to claim 1, wherein the first control circuit comprises a hold circuit holding the first signal in response to one of rising and falling edges of the fourth signal.

3. The semiconductor apparatus according to claim 1, further comprising a second control circuit receiving an operation control signal externally supplied to generate the fourth signal.

4. The semiconductor apparatus according to claim 1, further comprising a third control circuit receiving a control signal indicating a command and a state signal indicating an internal status of the semiconductor apparatus, performing a logic operation on the control signal and the state signal to generate the first signal.

5. The semiconductor apparatus according to claim 1, further comprising a fourth control circuit comparing a voltage potential of the first sub power supply line with a reference voltage potential to generate the fourth signal and providing the fourth signal to the first control circuit.

6. The semiconductor apparatus according to claim 5, wherein the fourth control circuit comprises a voltage generating portion including a plurality of resistive elements coupled in series between the first and the second power supply lines and generating the reference voltage.

7. The semiconductor apparatus according to claim 1, wherein the first signal is supplied from outside of the semiconductor apparatus to render the semiconductor apparatus a low power consumption state.

8. The semiconductor apparatus according to claim 1, further comprising:
    a second sub power supply line;
    a second switch circuit disposed between the second power supply line and the second sub power supply line, and rendered conductive in response to the first signal; and
    a second circuit disposed between the second sub power supply line and the first power supply line, and wherein the first circuit includes an output terminal and the second circuit is coupled to the output terminal of the first circuit at an input terminal thereof.

* * * * *